(12) United States Patent  (10) Patent No.: US 9,166,638 B2
Kan et al. (45) Date of Patent: Oct. 20, 2015

(54) INTEGRATED CIRCUIT CHIP FOR RECEIVER COLLECTING SIGNALS FROM SATELLITES

(71) Applicant: Rafael Microelectronics Incorporation, Hsinchu County (TW)

(72) Inventors: Meng-Ping Kan, Hsinchu (TW); Shi-Ming Wu, Changhua (TW)

(73) Assignee: Rafael Microelectronics, Inc., Hsin-Chu (TW)

( * ) Notice: Subject to any disclaimer, the term of this patent is extended or adjusted under 35 U.S.C. 154(b) by 139 days.

(21) Appl. No.: 14/180,363

(22) Filed: Feb. 14, 2014

(65) Prior Publication Data

US 2015/0236738 A1 Aug. 20, 2015

(51) Int. Cl.
*H04B 1/12* (2006.01)
*H03F 3/45* (2006.01)
*H03F 3/19* (2006.01)
*H04B 7/185* (2006.01)

(52) U.S. Cl.
CPC .................. *H04B 1/123* (2013.01); *H03F 3/19* (2013.01); *H03F 3/45076* (2013.01); *H04B 7/18513* (2013.01); *H03F 2200/421* (2013.01); *H03F 2203/45051* (2013.01)

(58) Field of Classification Search
CPC ............................................. H03F 2203/45051
See application file for complete search history.

(56) References Cited

U.S. PATENT DOCUMENTS

2011/0025416 A1* 2/2011 Yamaguchi et al. ................... H03F 3/45179 330/253
2013/0169361 A1* 7/2013 Killat ................... H03F 3/45183 330/253

* cited by examiner

*Primary Examiner* — Jianye Wu

(57) ABSTRACT

An integrated circuit chip includes a first single-ended-to-differential amplifier configured to generate a differential output associated with an input of said first single-ended-to-differential amplifier; a second single-ended-to-differential amplifier arranged in parallel with said first single-ended-to-differential amplifier; a first set of switch circuits arranged downstream of said first single-ended-to-differential amplifier; a second set of switch circuits arranged downstream of said second single-ended-to-differential amplifier; and a first differential-to-single-ended amplifier arranged downstream of a first one of said switch circuits in said first set and downstream of a first one of said switch circuits in said second set.

20 Claims, 9 Drawing Sheets

INTEGRATED CIRCUIT CHIP FOR RECEIVER COLLECTING SIGNALS FROM SATELLITES

BACKGROUND OF THE DISCLOSURE

1. Field of the Disclosure

The present invention relates generally to an integrated circuit chip for a satellite receiver, and more particularly to an integrated circuit chip embedded with a switch matrix, multiple single-ended-to-differential amplifiers arranged in parallel and upstream of the switch matrix and multiple differential-to-single-ended amplifiers arranged in parallel and downstream of the switch matrix.

2. Brief Description of the Related Art

Satellite television has become increasingly popular due to various contents. A satellite television system typically includes an antenna array configured to collect signals from satellites and a satellite receiver containing amplifiers configured to amplify the collected signals, band-pass filters (BPF) configured to pass the collected signals at frequencies within a certain frequency range and to attenuate the collected signals at frequencies outside the frequency range, and mixers configured to convert the collected signals at radio frequencies into ones at intermediate frequencies. Thereby, the collected signals may be processed into optimum amplified signals in a base or intermediate frequency band so as to be demodulated in a set top box.

SUMMARY OF THE DISCLOSURE

The present invention provides an integrated circuit chip for a signal receiver configured to collect signals from one or more satellites in a field of view of the signal receiver.

The integrated circuit chip may include a first single-ended-to-differential amplifier configured to generate a differential output associated with an input of the first single-ended-to-differential amplifier; a second single-ended-to-differential amplifier arranged in parallel with the first single-ended-to-differential amplifier, wherein the second single-ended-to-differential amplifier is configured to generate a differential output associated with an input of the second single-ended-to-differential amplifier; a first set of switch circuits arranged downstream of the first single-ended-to-differential amplifier, wherein one of the switch circuits in the first set comprises a differential input associated with the differential output of the first single-ended-to-differential amplifier; a second set of switch circuits arranged downstream of the second single-ended-to-differential amplifier, wherein one of the switch circuits in the second set comprises a differential input associated with the differential output of the second single-ended-to-differential amplifier; and a first differential-to-single-ended amplifier arranged downstream of a first one of the switch circuits in the first set and downstream of a first one of the switch circuits in the second set, wherein the first differential-to-single-ended amplifier comprises a differential input associated with a differential output of the first one of the switch circuits in the first set.

Alternatively, the integrated circuit chip may further include a second differential-to-single-ended amplifier arranged downstream of a second one of the switch circuits in the first set and downstream of a second one of the switch circuits in the second set, wherein the second differential-to-single-ended amplifier comprises a differential input associated with a differential output of the second one of the switch circuits in the first set or a differential output of the second one of the switch circuits in the second set.

Alternatively, the integrated circuit chip may further include a first set of differential-to-differential amplifiers arranged downstream of the first single-ended-to-differential amplifier and upstream of the first set of switch circuits, wherein one of the differential-to-differential amplifiers in the first set comprises a differential input is associated with the differential output of the first single-ended-to-differential amplifier and a differential output associated with the differential input of said one of the switch circuits in the first set, and a second set of differential-to-differential amplifiers arranged downstream of the second single-ended-to-differential amplifier and upstream of the second set of switch circuits, wherein one of the differential-to-differential amplifiers in the second set comprises a differential input is associated with the differential output of the second single-ended-to-differential amplifier and a differential output associated with the differential input of said one of the switch circuits in the second set.

Alternatively, the differential output of the first single-ended-to-differential amplifier has a phase difference of 180 degrees. The differential output of said one of the switch circuits in the first set has a phase difference of 180 degrees. The differential input of said one of the switch circuits in the first set has a phase difference of 180 degrees. The differential input of the first differential-to-single-ended amplifier has a phase difference of 180 degrees.

Alternatively, the integrated circuit chip is assembled in a signal receiver configured to process multiple signals from one or more satellites.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
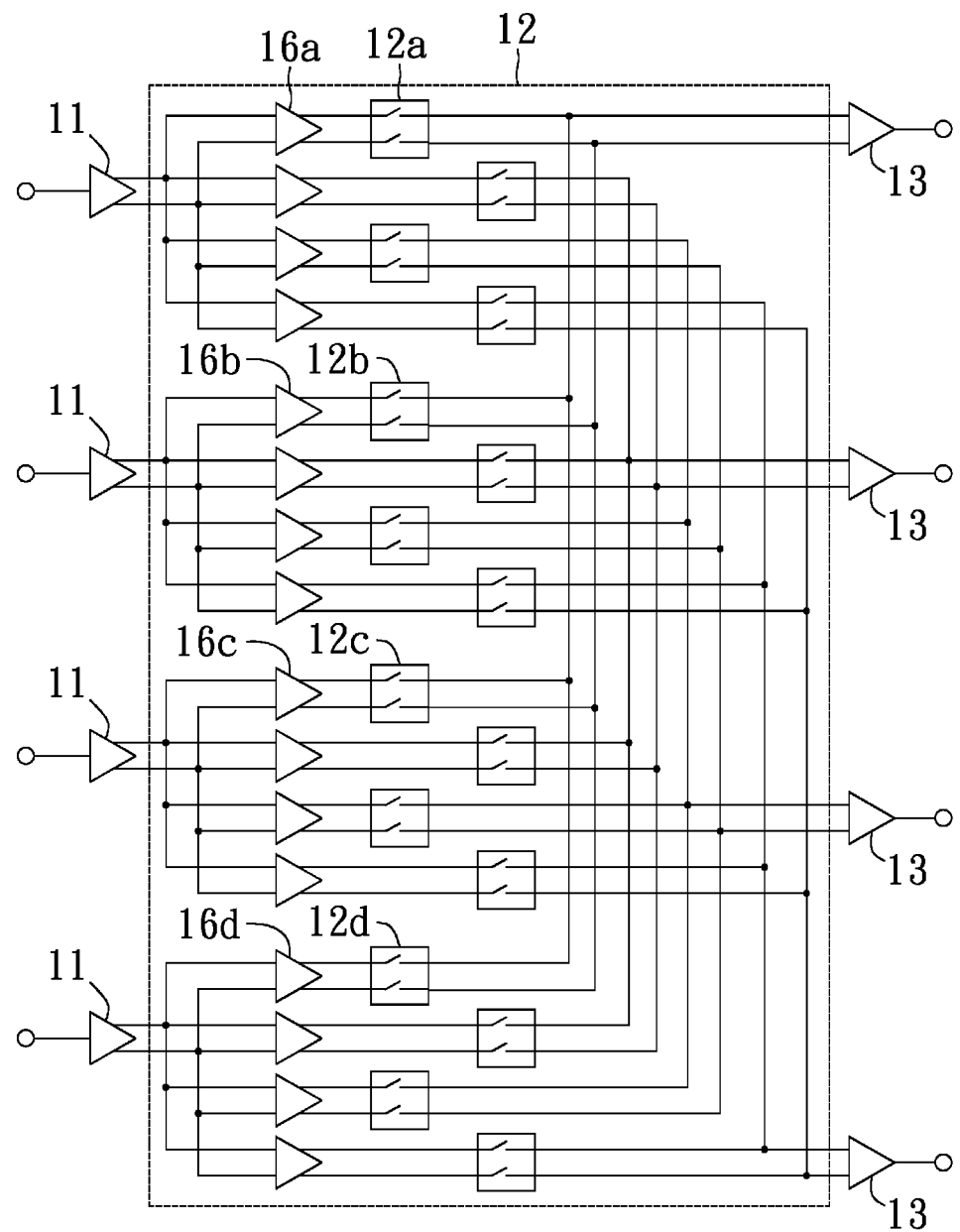
FIG. 1 illustrates a block diagram of an integrated circuit chip in accordance with a first embodiment of the present invention.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

FIG. 1 illustrates a block diagram of an integrated circuit chip 10 in accordance with a first embodiment of the present invention. The integrated circuit chip 10 may be employed in a signal receiver, such as low-noise block (LNB), configured to process data streams or signals from one or more satellites in a field of view of the signal receiver.

Referring to FIG. 1, the integrated circuit chip 10 may include (1) four single-ended-to-differential amplifiers 11 arranged in parallel, (2) a first set of four differential-to-differential amplifiers 16a, i.e. the topmost four, arranged in parallel and downstream of a first one, i.e. the topmost one, of the four single-ended-to-differential amplifiers 11, (3) a second set of four differential-to-differential amplifiers 16b, i.e. the second top four, arranged in parallel and downstream of a second one, i.e. the second top one, of the four single-ended-to-differential amplifiers 11, (4) a third set of four differential-to-differential amplifiers 16c, i.e. the second bottom four, arranged in parallel and downstream of a third one, i.e. the second bottom one, of the four single-ended-to-differential amplifiers 11, (5) a fourth set of four differential-to-differential amplifiers 16d, i.e. the bottommost four, arranged in parallel and downstream of a fourth one, i.e. the bottommost one, of the four single-ended-to-differential amplifiers 11, (6) a switch matrix having a first set of four switch circuits 12a, i.e. the topmost four, arranged in parallel and downstream of the four differential-to-differential amplifiers 16a in the first set, a second set of four switch circuits 12b, i.e. the second top four, arranged in parallel and downstream of the four differential-to-differential amplifiers 16b in the second set, a third set of four switch circuits 12c, i.e. the second bottom four, arranged in parallel and downstream of the four differential-to-differential amplifiers 16c in the third set, and a fourth set of four switch circuits 12d, i.e. the bottommost four, arranged in parallel and downstream of the four differential-to-differential amplifiers 16d in the fourth set, (7) four differential-to-single-ended amplifiers 13 arranged in parallel and downstream of the switch matrix, wherein a first one of the four differential-to-single-ended amplifiers 13, i.e. the topmost one, may be arranged downstream of the topmost ones of the switch circuits 12a-12d in the first through fourth sets, a second one of the four differential-to-single-ended amplifiers 13, i.e. the second top one, may be arranged downstream of the second top ones of the switch circuits 12a-12d in the first through fourth sets, a third one of the four differential-to-single-ended amplifiers 13, i.e. the second bottom one, may be arranged downstream of the second bottom ones of the switch circuits 12a-12d in the first through fourth sets, and a fourth one of the four differential-to-single-ended amplifiers 13, i.e. the bottommost one, may be arranged downstream of the bottommost ones of the switch circuits 12a-12d in the first through fourth sets.

Referring to FIG. 1, each of the single-ended-to-differential amplifiers 11, i.e. differential amplifiers, may have its input to be amplified as a differential output of said each of the single-ended-to-differential amplifiers 11, wherein the differential output of said each of the single-ended-to-differential amplifiers 11 is associated with the input of said each of the single-ended-to-differential amplifiers 11 and has phase difference of substantially 180 degrees. Each of the differential-to-differential amplifiers 16a-16d in the first through fourth sets may have a differential input to be amplified as a differential output of said each of the differential-to-differential amplifiers 16a-16d in the first through fourth sets, wherein the differential output of said each of the differential-to-differential amplifiers 16a-16d in the first through fourth sets has phase difference of substantially 180 degrees and the differential input of said each of the differential-to-differential amplifiers 16a-16d in the first through fourth sets has phase difference of substantially 180 degrees, wherein the differential output of said each of the differential-to-differential amplifiers 16a-16d in the first through fourth sets is associated with the differential input of said each of the differential-to-differential amplifiers 16a-16d in the first through fourth sets. Each of the differential-to-single-ended amplifiers 13, i.e. differential amplifiers, may have its differential input to be amplified as an output of said each of the differential-to-single-ended amplifiers 13, wherein the output of said each of the differential-to-single-ended amplifiers 13 is associated with the differential input of said each of the differential-to-single-ended amplifiers 13 and the differential input of said each of the differential-to-single-ended amplifiers 13 has phase difference of substantially 180 degrees.

Referring to FIG. 1, the switch matrix may be a differential passive switch matrix having four switch circuits 12a, 12b, 12c or 12d in each of the first through fourth sets having four respective differential inputs coupled respectively to four of the sixteen differential-to-differential amplifiers 16a-16d in a corresponding one of the first through fourth sets and four respective differential outputs coupled respectively to the four differential-to-single-ended amplifiers 13. The first set of four switch circuits 12a may be controlled to or not to couple the first set of four differential-to-differential amplifiers 16a to the four differential-to-single-ended amplifiers 13 respectively. The second set of four switch circuits 12b may be controlled to or not to couple the second set of four differential-to-differential amplifiers 16b to the four differential-to-single-ended amplifiers 13 respectively. The third set of four switch circuits 12c may be controlled to or not to couple the third set of four differential-to-differential amplifiers 16c to the four differential-to-single-ended amplifiers 13 respectively. The fourth set of four switch circuits 12d may be controlled to or not to couple the fourth set of four differential-to-differential amplifiers 16d to the four differential-to-single-ended amplifiers 13 respectively.

Referring to FIG. 1, one of the differential-to-differential amplifiers 16a-16d may be switched to be powered on when one of the switch circuits 12a-12d having the differential input coupled to the differential output of said one of the differential-to-differential amplifiers 16a-16d is switched to couple said one of the differential-to-differential amplifiers 16a-16d to one of the four differential-to-single-ended amplifiers 13. One of the differential-to-differential amplifiers 16a-16d may be switched to be powered off when one of the switch circuits 12a-12d having the differential input coupled to the differential output of said one of the differential-to-differential amplifiers 16a-16d is switched not to couple said one of the differential-to-differential amplifiers 16a-16d to one of the four differential-to-single-ended amplifiers 13. For example, the topmost one of the differential-to-differential amplifiers 16a may be switched to be powered on when the topmost one of the switch circuits 12a is switched to couple the topmost one of the differential-to-differential amplifiers 16a to the topmost one of the four differential-to-single-ended amplifiers 13. The topmost one of the differential-to-differential amplifiers 16a may be switched to be powered off when the topmost one of the switch circuits 12a is switched not to couple the topmost one of the differential-to-differential amplifiers 16a to the topmost one of the four differential-to-single-ended amplifiers 13.

For an example, referring to FIG. 1, the switch matrix may switch the first one of the four single-ended-to-differential amplifiers 11 to be coupled to the first and second ones of the four differential-to-single-ended amplifiers 13 and may switch the second one of the four single-ended-to-differential amplifiers 11 to be coupled to third and fourth ones of the four differential-to-single-ended amplifiers 13. Accordingly, the outputs of the first and second ones of the differential-to-single-ended amplifiers 13 are associated with the input of the first one of the single-ended-to-differential amplifiers 11, and the outputs of the third and fourth ones of the differential-to-single-ended amplifiers 13 are associated with the input of the second one of the single-ended-to-differential amplifiers 11. The first and second ones of the four differential-to-single-ended amplifiers 13 may have the two respective outputs having the same first band width at the first center frequency as the input of the first one of the four single-ended-to-differential amplifiers 11. The third and fourth ones of the four differential-to-single-ended amplifiers 13 may have the two respective outputs having the same second band width at the second center frequency as the input of the second one of the four single-ended-to-differential amplifiers 11. The first band width may have the same frequency range as the second band width. The first center frequency may be different from the second center frequency and the respective inputs of the first and second ones of the four single-ended-to-differential amplifiers 11 have the same polarization, such as either of vertical, horizontal, right-hand circular and left-hand circular polarizations. Alternatively, the first center frequency may be the same as the second center frequency and the respective inputs of the first and second ones of the single-ended-to-differential amplifiers 11 have different polarizations, such as vertical and horizontal polarizations respectively or right-hand and left-hand circular polarizations respectively. Alternatively, the first center frequency may be different from the second center frequency and the respective inputs of the first and second ones of the single-ended-to-differential amplifiers 11 have different polarizations, such as vertical and horizontal polarizations respectively or right-hand and left-hand circular polarizations respectively.

For another example, referring to FIG. 1, the switch matrix may switch the first one of the four single-ended-to-differential amplifiers 11 to be coupled to the first one of the four differential-to-single-ended amplifiers 13, switch the second one of the four single-ended-to-differential amplifiers 11 to be coupled to the second one of the four differential-to-single-ended amplifiers 13, switch the third one of the four single-ended-to-differential amplifiers 11 to be coupled to the third one of the four differential-to-single-ended amplifiers 13 and switch the fourth one of the four single-ended-to-differential amplifiers 11 to be coupled to the fourth one of the four differential-to-single-ended amplifiers 13. Accordingly, the output of the first one of the differential-to-single-ended amplifiers 13 is associated with the input of the first one of the single-ended-to-differential amplifiers 11, the output of the second one of the differential-to-single-ended amplifiers 13 is associated with the input of the second one of the single-ended-to-differential amplifiers 11, the output of the third one of the differential-to-single-ended amplifiers 13 is associated with the input of the third one of the single-ended-to-differential amplifiers 11 and the output of the fourth one of the differential-to-single-ended amplifiers 13 is associated with the input of the fourth one of the single-ended-to-differential amplifiers 11. The first one of the four differential-to-single-ended amplifiers 13 may have the output having the same first band width at the first center frequency as the input of the first one of the four single-ended-to-differential amplifiers 11. The second one of the four differential-to-single-ended amplifiers 13 may have the output having the same second band width at the second center frequency as the input of the second one of the four single-ended-to-differential amplifiers 11. The third one of the four differential-to-single-ended amplifiers 13 may have the output having the same third band width at the third center frequency as the input of the third one of the four single-ended-to-differential amplifiers 11. The fourth one of the four differential-to-single-ended amplifiers 13 may have the output having the same fourth band width at the fourth center frequency as the input of the fourth one of the four single-ended-to-differential amplifiers 11. The first band width may have the same frequency range as the second, third and fourth band widths have. For consideration of polarization, the inputs of the first and third ones of the four single-ended-to-differential amplifiers 11 may have a vertical polarization, and the inputs of the second and fourth ones of the four single-ended-to-differential amplifiers 11 may have a horizontal polarization; alternatively, the inputs of the first and third ones of the four single-ended-to-differential amplifiers 11 may have a right-hand circular polarization, and the inputs of the second and fourth ones of the four single-ended-to-differential amplifiers 11 may have a left-hand circular polarization, as an example for the following first through seventh combinations. The first center frequency may be the same as the second center frequency and the respective inputs of the first and second ones of the single-ended-to-differential amplifiers 11 have different polarizations, such as vertical and horizontal polarizations respectively or right-hand and left-hand circular polarizations respectively. The first center frequency may be different from the third center frequency and the respective inputs of the first and third ones of the single-ended-to-differential amplifiers 11 have the same polarization, such as either of vertical, horizontal, right-hand circular and left-hand circular polarizations. The first center frequency may be different from the fourth center frequency and the respective inputs of the first and fourth ones of the single-ended-to-differential amplifiers 11 have different polarizations, such as vertical and horizontal polarizations respectively or right-hand and left-hand circular polarizations respectively.

Referring to FIG. 1, each of the differential-to-single-ended amplifiers 13 may have its differential input to be amplified as an output of said each of the four amplifiers 13 and have an optimum 1 dB compression point (P1 dB) to prevent electronic devices downstream of the four respective amplifiers 13 from being burned out when an excessive power flows through one of the four differential-to-single-ended amplifiers 13.

Thereby, the integrated circuit chip 10 may provide the switch circuits 12a-12d for switching differential signals with phase difference of substantially 180 degrees such that crosstalk may be reduced and signal isolation may be enhanced. Furthermore, the differential-to-differential amplifiers 16a-16d may be arranged upstream of the switch circuits 12a-12d to amplify the inputs of the switch circuits 12a-12d for good gain balance.

Figure 2:
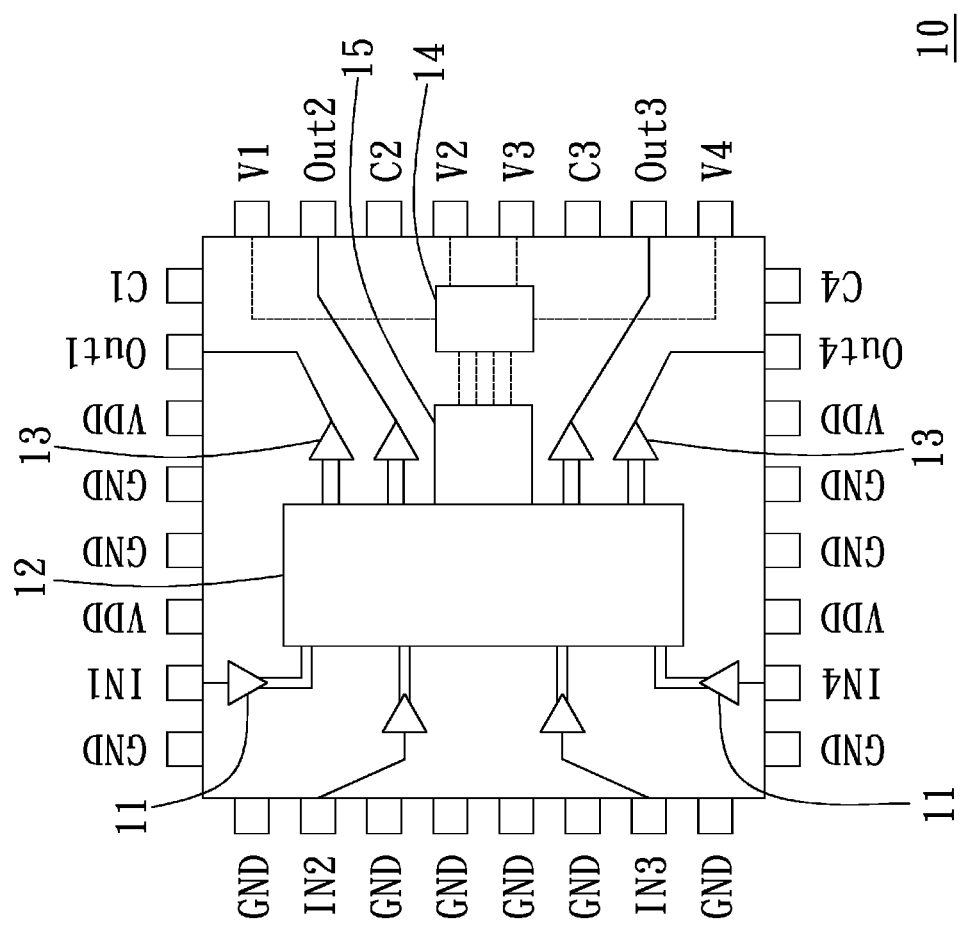
FIG. 2 illustrates a pin assignment of the integrated circuit chip 10 in accordance with the first embodiment of the present invention.

FIG. 2 illustrates a pin assignment of the integrated circuit chip 10 in accordance with the first embodiment of the present invention. Referring to FIG. 2, the integrated circuit chip 10 includes four pins IN1, 1N2, 1N3 and 1N4 coupled respectively to the four respective inputs of the four single-ended-to-differential amplifiers 11, four pins Out1, Out2, Out3 and Out4 coupled respectively to the four respective outputs of the four differential-to-single-ended amplifiers 13 and a circuit block 12 incorporating the first through fourth sets of switch circuits 12a-12d and the first through fourth sets of differential-to-differential amplifiers 16a-16d as mentioned in the above embodiment.

Referring to FIG. 2, the integrated circuit chip 10 may further include a voltage and tone detector 14 having four inputs coupled respectively to four pins V1, V2, V3 and V4 of the integrated circuit chip 10 and a decoder 15 arranged downstream of the voltage and tone detector 14 and upstream of the switch matrix of the circuit block 12, for example. The voltage and tone detector 14 may detect whether each of the voltages at the four respective pins V1, V2, V3 and V4, at the four respective inputs of the voltage and tone detector 14, is at a high logic level or a low logic level as a corresponding one of outputs of the voltage and tone detector 14 to be coupled to a corresponding one of inputs of the decoder 15. The decoder 15 may decode its inputs to control the switch matrix of the circuit block 12 to switch or pass one of the four single-ended-to-differential amplifiers 11 to be coupled to one of the four differential-to-single-ended amplifiers 13 and to control the differential-to-differential amplifiers 16a-16d to be powered on or off.

Referring to FIG. 2, the integrated circuit chip 10 may further include multiple pins GND coupled to ground nodes of the amplifiers 11, 13 and 16a-16d, switch circuits 12a-12d, voltage and tone detector 14 and decoder 15 or a ground reference of the integrated circuit chip 10 so as to provide a ground voltage to the amplifiers 11, 13 and 16a-16d, switch circuits 12a-12d, voltage and tone detector 14 and decoder 15. The integrated circuit chip 10 may further include multiple pins VDD coupled to power nodes of the amplifiers 11, 13 and 16a-16d, switch circuits 12a-12d, voltage and tone detector 14 and decoder 15 so as to supply power to the amplifiers 11, 13 and 16a-16d, switch circuits 12a-12d, voltage and tone detector 14 and decoder 15. The integrated circuit chip 10 may further include multiple pins C1-C4 acting as an internal alternate-current (AC) ground.

Figure 3:
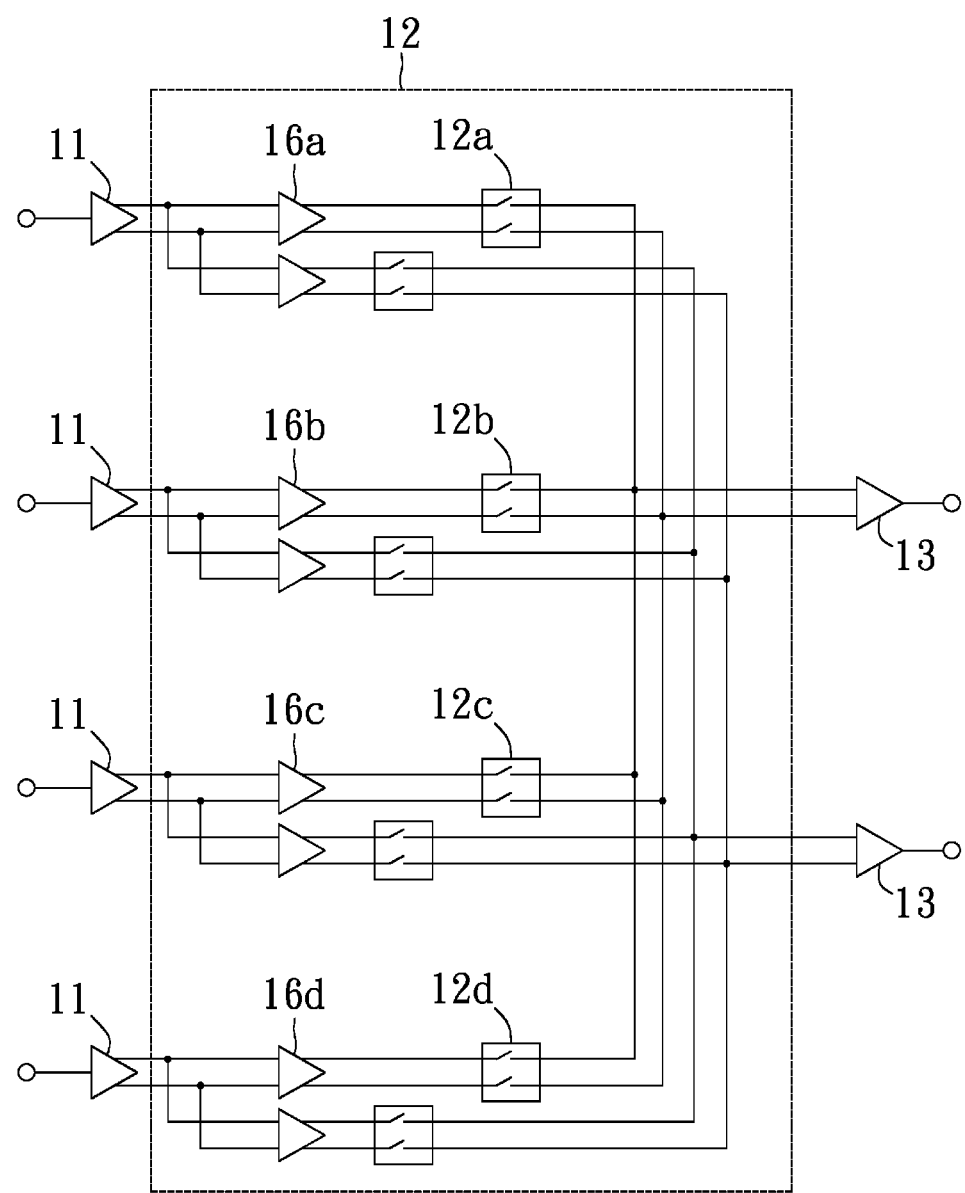
FIG. 3 illustrates a block diagram of an integrated circuit chip in accordance with a second embodiment of the present invention.

Alternatively, FIG. 3 illustrates a block diagram of an integrated circuit chip in accordance with a second embodiment of the present invention. The same reference number illustrated in FIGS. 1 and 3 indicates elements having the same functions. Referring to FIG. 3, the integrated circuit chip 10 may include (1) four single-ended-to-differential amplifiers 11 arranged in parallel, (2) a first set of two differential-to-differential amplifiers 16a, i.e. the topmost two, arranged in parallel and downstream of a first one, i.e. the topmost one, of the four single-ended-to-differential amplifiers 11, (3) a second set of two differential-to-differential amplifiers 16b, i.e. the second top two, arranged in parallel and downstream of a second one, i.e. the second top one, of the four single-ended-to-differential amplifiers 11, (4) a third set of two differential-to-differential amplifiers 16c, i.e. the second bottom two, arranged in parallel and downstream of a third one, i.e. the second bottom one, of the four single-ended-to-differential amplifiers 11, (5) a fourth set of two differential-to-differential amplifiers 16d, i.e. the bottommost two, arranged in parallel and downstream of a fourth one, i.e. the bottommost one, of the four single-ended-to-differential amplifiers 11, (6) a switch matrix having a first set of two switch circuits 12a, i.e. the topmost two, arranged in parallel and downstream of the two differential-to-differential amplifiers 16a in the first set, a second set of four switch circuits 12b, i.e. the second top two, arranged in parallel and downstream of the two differential-to-differential amplifiers 16b in the second set, a third set of two switch circuits 12c, i.e. the second bottom two, arranged in parallel and downstream of the two differential-to-differential amplifiers 16c in the third set, and a fourth set of four switch circuits 12d, i.e. the bottommost two, arranged in parallel and downstream of the two differential-to-differential amplifiers 16d in the fourth set, (7) two differential-to-single-ended amplifiers 13 arranged in parallel and downstream of the switch matrix, wherein a first one of the two differential-to-single-ended amplifiers 13, i.e. the top one, may be arranged downstream of the top ones of the switch circuits 12a-12d in the first through fourth sets, and a second one of the two differential-to-single-ended amplifiers 13, i.e. the bottom one, may be arranged downstream of the bottom ones of the switch circuits 12a-12d in the first through fourth sets.

Physical Infrastructure for Integrated Circuit Chip

Referring to FIGS. 1, 2 and 3, the integrated circuit chip 10 may include a semiconductor substrate, such as silicon substrate, having its active devices, such as transistors, its passive devices, such as resistors, capacitors and/or inductors, and its conductive traces, such as damascene electroplated cupper traces or sputtered aluminum traces, formed on or over the silicon substrate.

For the first and second embodiments, referring to FIGS. 1, 2 and 3, these active devices, passive devices and conductive traces compose the amplifiers 11, 13 and 16a-16d, switch circuits 12a-12d, voltage and tone detector 14 and decoder 15 formed over the common semiconductor substrate, and some of the conductive traces may form the connection between each of the four single-ended-to-differential amplifiers 11 and the corresponding set of differential-to-differential amplifiers 16a, 16b, 16c or 16d, between each of the differential-to-differential amplifiers 16a-16d and the corresponding one of the switch circuits 12a-12d, between each of the four differential-to-single-ended amplifiers 13 and the corresponding set of switch circuits 12a, 12b, 12c or 12d, between the decoder 15 and the switch circuits 12a-12d, between the decoder 15 and the differential-to-differential amplifiers 16a-16d, and between the decoder 15 and the voltage and tone detector 14.

Package for Integrated Circuit Chip

Figure 4:
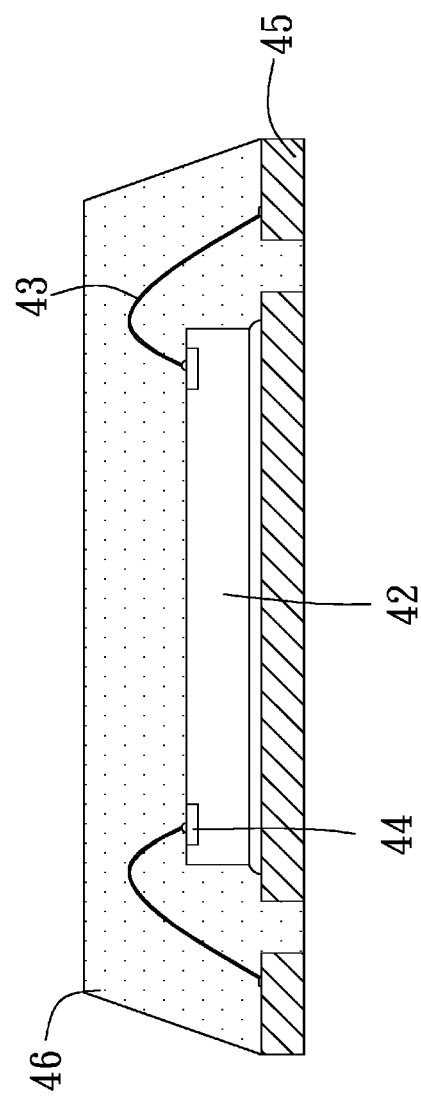
FIG. 4 shows a schematically cross-sectional view of a second type of electronic package for an integrated circuit chip.

FIG. 4 shows a schematically cross-sectional view of a second type of electronic package for an integrated circuit chip. Referring to FIG. 4, the second type of electronic package 40 may include (1) a lead frame 41, (2) an integrated circuit chip 42 attached to a top surface of the lead frame 42, (3) multiple wirebonded wires 43 each extending across over a corresponding edge of the integrated circuit chip 42 to electrically connect a corresponding metal pad 44 of the integrated circuit chip 42 to a corresponding metal lead or pin 45 of the lead frame 42 and (4) a mold 46 formed over the top surface of the lead frame 41 to encapsulate the integrated circuit chip 42 and the wirebonded wires 43.

Referring to FIGS. 1, 2, 3 and 4, the integrated circuit chip 42 may be either one of the integrated circuit chips 10 as mentioned in the above embodiments. Some of the metal pads 44 of the integrated circuit chip 42 may be connected respectively to the inputs of the single-ended-to-differential amplifiers 11 and some other of the metal pads 44 of the integrated circuit chip 42 may be connected respectively to the outputs of the differential-to-single-ended amplifiers 13; each of the metal pads 44 may be arranged with the same electrical function as a corresponding one of the pins IN1-IN4, Oust-Out4, VDD, GND, V1-V4 and C1-C4 provides.

Figure 5:
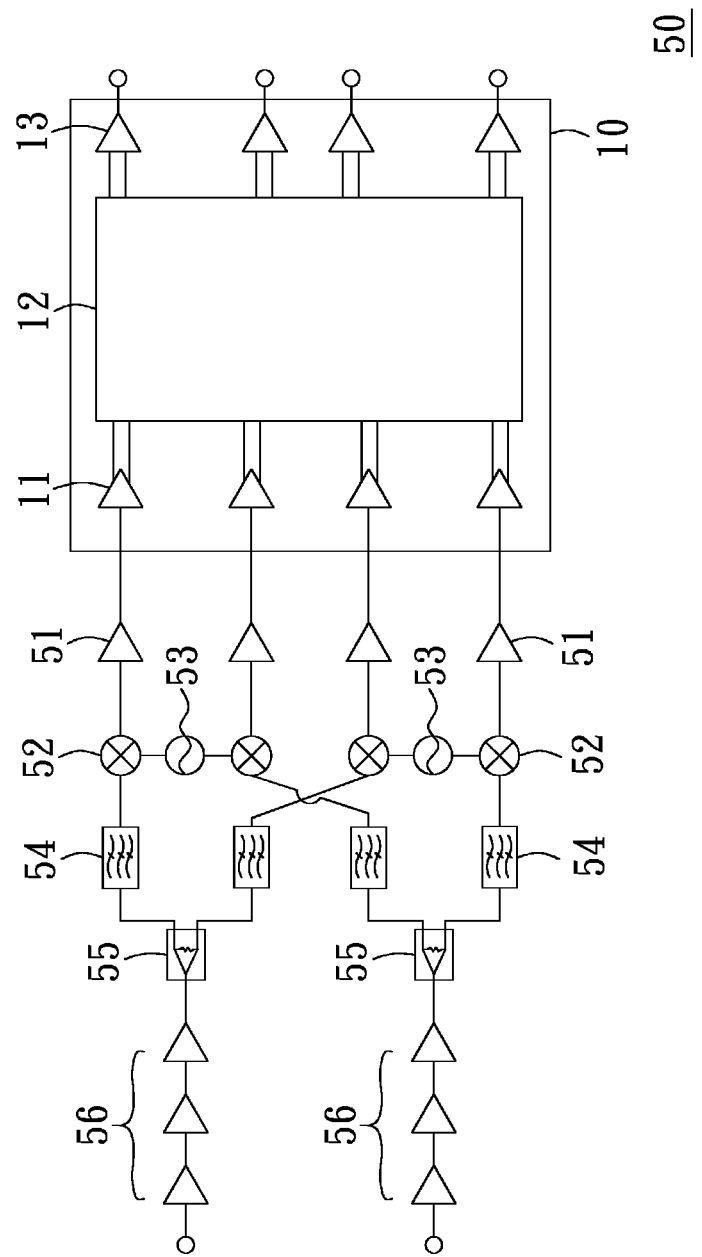
FIG. 5 illustrates a block diagram of a first combination for the integrated circuit chip illustrated in the first embodiment.

First Combination for Integrated Circuit Chip Illustrated in the First Embodiment FIG. 5 illustrates a block diagram of a first combination for the integrated circuit chip 10 illustrated in the first embodiment. The same reference number illustrated in FIGS. 1, 2 and 5 indicates elements having the same functions.

In the first combination, referring to FIG. 5, a signal receiver 50, such as low-noise block (LNB), may be provided to process vertically and horizontally polarized signals or right-hand and left-hand circularly polarized signals collected by an antenna feed horn at a focal point of a reflector dish for a satellite in a field of view of the signal receiver 50. The signal receiver 50 may include (1) the integrated circuit chip 10, (2) four amplifiers 51 arranged in parallel and upstream of the four respective amplifiers 11 of the integrated circuit chip 10, (3) four mixers 52 arranged in parallel and upstream of the four respective amplifiers 51, (4) two local oscillators (LO) 53 each coupled to two of the four mixers 52, wherein a first one of the local oscillators (LO) 53 is coupled to first and second ones, i.e. top two ones, of the four mixers 52 and a second one of the local oscillators (LO) 53 is coupled to third and fourth ones, i.e. bottom two ones, of the four mixers 52, (5) four band-pass filters (BPF) 54 arranged in parallel and upstream of the four respective mixers 52, wherein first, second, third and fourth ones (from top to bottom) of the four band-pass filters (BPF) 54 have four respective outputs coupled to four respective inputs of the first, third, second and fourth ones of the four mixers 23, respectively, (6) two splitters 55, i.e. power divider, arranged in parallel and upstream of the four band-pass filters (BPF) 54, wherein a first (top) one of the two splitters 55 has two outputs coupled respectively to two respective inputs of the first and second ones of the band-pass filters (BPF) 54 and a second (bottom) one of the two splitters 55 has two outputs coupled respectively to two respective inputs of the third and fourth ones of the band-pass filters (BPF) 54, and (7) two sets of three-stage amplifiers 56 arranged in parallel and upstream of the two respective splitters 55, wherein each of the two sets of three-stage amplifiers 56 includes three amplifiers arranged in series. Alternatively, the two sets of three-stage amplifiers 56 may be replaced by two sets of two-stage amplifiers arranged in parallel and upstream of the two respective splitters 55, wherein each of the two sets of two-stage amplifiers includes two amplifiers arranged in series. Alternatively, the two sets of three-stage amplifiers 56 may be replaced by two single-stage amplifiers arranged in parallel and upstream of the two respective splitters 55.

Referring to FIG. 5, each of the four amplifiers 51 may be a power amplifier, for example, having its input to be amplified as the output of said each of the amplifiers 51.

Referring to FIG. 5, the first and second ones of the four mixers 52 is configured to convert a fourth frequency band (F4), ranging from 3.0 GHz to 22.0 GHz, and preferably ranging from 10.7 GHz to 12.75 GHz, for example, at the inputs of the first and second ones of the mixers 52 into a fifth frequency band (F5), ranging from 10 Hz to 4 GHz and preferably ranging from 950 MHz to 2150 MHz, for example, at outputs of the first and second ones of the mixers 52 based on a frequency within a frequency range between 3.0 GHz and 20.0 GHz and preferably between 8.0 GHz and 12.0 GHz, such as 9.75 GHz, at an output of the first one of the local oscillators (LO) 53, which may be subtracted from the fourth frequency band (F4) to obtain the fifth frequency band (F5), wherein the fifth frequency band (F5) has an upper limit below a lower limit of the fourth frequency band (F4). The third and fourth ones of the four mixers 52 is configured to convert the fourth frequency band (F4), ranging from 3.0 GHz to 22.0 GHz, and preferably ranging from 10.7 GHz to 12.75 GHz, for example, at the inputs of the third and fourth ones of the mixers 52 into a sixth frequency band (F6), ranging from 10 Hz to 4 GHz and preferably ranging from 950 MHz to 2150 MHz, for example, at outputs of the third and fourth ones of the mixers 52 based on a frequency within a frequency range between 3.0 GHz and 20.0 GHz and preferably between 8.0 GHz and 12.0 GHz, such as 10.6 GHz, at an output of the second one of the local oscillators (LO) 53, which may be subtracted from the fourth frequency band (F4) to obtain the sixth frequency band (F6), wherein the sixth frequency band (F6) has an upper limit below a lower limit of the fourth frequency band (F4). The sixth frequency band (F6) has a lower limit below that of the fifth frequency band (F5) and an upper limit below that of the fifth frequency band (F5). The outputs of the four mixers 52 may be coupled respectively to inputs of the four amplifiers 51.

Referring to FIG. 5, each of the four band-pass filters (BPF) 54 may pass its input at frequencies within a certain frequency range and attenuate its input at frequencies outside the frequency range as an output of said each of the band-pass filters (BPF) 54. The outputs of the first, second, third and fourth ones of the band-pass filters (BPF) 54 are coupled respectively to inputs of the first, third, second and fourth ones of the mixers 54.

Referring to FIG. 5, each of the four splitters 55 may split its input into two identities with substantially the same power at two respective outputs of said each of the splitters 55. The two outputs of the first one of the splitters 55 are coupled to the respective inputs of the first and second ones of the band-pass filters (BPF) 54, respectively. The two outputs of the second one of the splitters 55 are coupled to the respective inputs of the third and fourth ones of the band-pass filters (BPF) 54, respectively.

Referring to FIG. 5, each amplifier in each set of three-stage amplifiers 56 may be a low noise amplifier (LNA), for example, having its input to be amplified as an output of said each amplifier. Accordingly, each of the two sets of three-stage amplifiers 56 may have its input to be amplified stage by stage as an output of said each of the two sets of three-stage amplifiers 56, and thus said each of the two sets of three-stage amplifiers 56 has the output amplified with a low noise. The vertically polarized signal collected from the antenna feed horn may be transmitted to the input of one, i.e. top one, of the two sets of three-stage amplifiers 56, and the horizontally polarized signal collected from the antenna feed horn may be transmitted to the input of the other one, i.e. bottom one, of the two sets of three-stage amplifiers 56; alternatively, the right-hand circularly polarized signal collected from the antenna feed horn may be transmitted to the input of one, i.e. top one, of the two sets of three-stage amplifiers 56, and the left-hand circularly polarized signal collected from the antenna feed horn may be transmitted to the input of the other one, i.e. bottom one, of the two sets of three-stage amplifiers 56.

Referring to FIG. 5, the signal receiver 50 may generate four outputs from the four respective amplifiers 13 of the integrated circuit chip 10 to four respective set top boxes in an indoor system through four respective cables.

Referring to FIG. 5, the integrated circuit chip 10 may be packaged like the above electronic package 40 to be mounted onto a mother circuit board (not shown) via the metal pins 45. Each of the amplifiers 51, each of the mixers 52, each of the local oscillators (LO) 53, each of the band-pass filters (BPF) 54, each of the splitters 55 and each one in each set of three-stage amplifiers 56 may be implemented in another corresponding discrete integrated circuit chip to be packaged into another corresponding discrete electronic package that may be mounted onto the mother circuit board (not shown) via solder balls or metal pins of the another corresponding discrete electronic package, for example.

Alternatively, referring to FIG. 5, the first one of the splitters 55 may be coupled to the first and third ones of the four mixers 52 with omission of two, i.e. top two, of the four band-pass filters (BPF) 22 from two respective signal paths between the first one of the splitters 55 and the first and third ones of the four mixers 52. The second one of the splitters 55 may be coupled to the second and fourth ones of the four mixers 52 with omission of another two, i.e. bottom two, of the four band-pass filters (BPF) 22 from two respective signal paths between the second one of the splitters 55 and the second and fourth ones of the four mixers 52.

Figure 6:
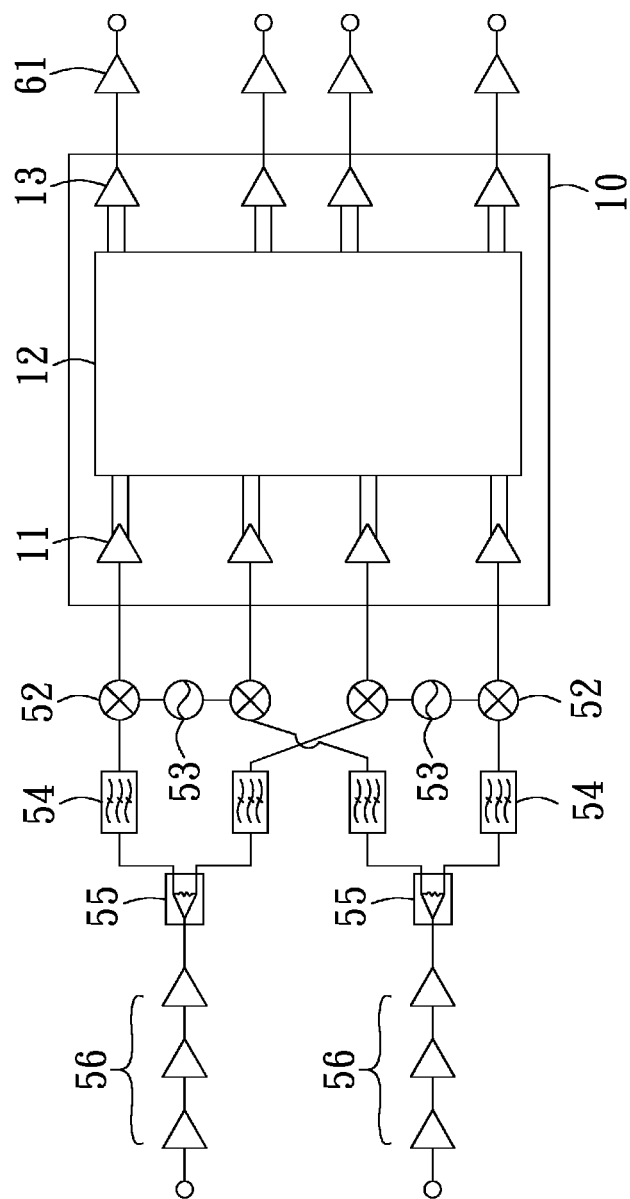
FIG. 6 illustrates a block diagram of a second combination for the integrated circuit chip illustrated in the first embodiment.

Second combination for integrated circuit chip illustrated in the first embodiment FIG. 6 illustrates a block diagram of a second combination for the integrated circuit chip 10 illustrated in the first embodiment. The same reference number illustrated in FIGS. 1, 5 and 6 indicates elements having the same functions.

In the second combination, referring to FIG. 6, another signal receiver 60, such as low-noise block (LNB), may be provided to process vertically and horizontally polarized signals or right-hand and left-hand circularly polarized signals collected by an antenna feed horn at a focal point of a reflector dish for a satellite in a field of view of the signal receiver 60. The signal receiver 60, in comparison to the signal receiver 50 illustrated in FIG. 5, may further include four amplifiers 61 arranged in parallel and downstream of the four respective amplifiers 13 of the integrated circuit chip 10. Each of the four amplifiers 61 may have its input to be amplified as an output of said each of the four amplifiers 61 and have an optimum 1 dB compression point (P1 dB) to prevent electronic devices downstream of the four respective amplifiers 61 from being burned out when an excessive power is provided to one of the four amplifiers 61. Alternatively, the four amplifiers 51 illustrated in FIG. 5 may be omitted respectively from four respective signal paths between the four mixers 52 and the four amplifiers 11 of the integrated circuit chip 1 such that the outputs of the four mixers 52 may be coupled respectively to the inputs of the four amplifiers 11 of the integrated circuit chip 10.

Referring to FIG. 6, the signal receiver 60 may generate four outputs from the four respective amplifiers 61 to four respective set top boxes in an indoor system through four respective cables.

Referring to FIG. 6, the integrated circuit chip 10 may be packaged like the above electronic package 40 to be mounted onto a mother circuit board (not shown) via the metal pins 45. Each of the mixers 52, each of the local oscillators (LO) 53, each of the band-pass filters (BPF) 54, each of the splitters 55, each one in each set of three-stage amplifiers 56 and each of the amplifiers 61 may be implemented in another corresponding discrete integrated circuit chip to be packaged into another corresponding discrete electronic package that may be mounted onto the mother circuit board (not shown) via solder balls or metal pins of the another corresponding discrete electronic package, for example.

Figure 7:
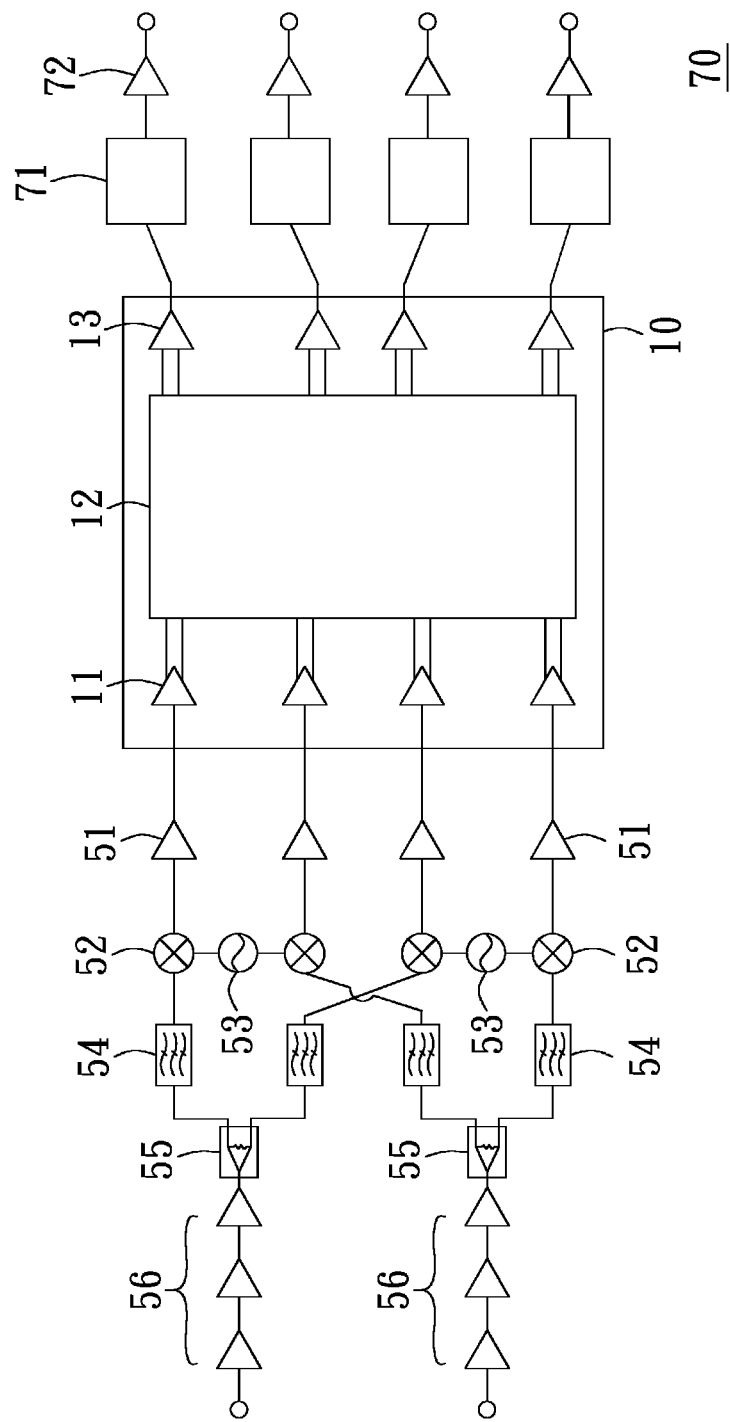
FIG. 7 illustrates a block diagram of a third combination for the integrated circuit chip illustrated in the first embodiment.

Third Combination for Integrated Circuit Chip Illustrated in the First Embodiment FIG. 7 illustrates a block diagram of a third combination for the integrated circuit chip 10 illustrated in the first embodiment. The same reference number illustrated in FIGS. 1, 5, 6 and 7 indicates elements having the same functions.

In the third combination, referring to FIG. 7, another signal receiver 70, such as low-noise block (LNB), may be provided to process vertically and horizontally polarized signals or right-hand and left-hand circularly polarized signals collected by an antenna feed horn at a focal point of a reflector dish for a satellite in a field of view of the signal receiver 70. The signal receiver 70, in comparison to the block diagram illustrated in FIG. 5, may further include four channel routers 71 arranged in parallel and downstream of the four respective amplifiers 13 of the integrated circuit chip 10 and four amplifiers 72 arranged in parallel and downstream of the four respective channel routers 71.

Referring to FIG. 7, each of the four channel routers 71 may be controlled to select one from multiple frequency sub-bands within a seventh frequency band (F7), ranging from 10 Hz to 4 GHz and preferably ranging from 950 MHz to 2150 MHz, for example, at its input of said each of the four channel routers 71 and convert the selected one of the frequency sub-bands into a predetermined frequency sub-band within the seventh frequency band (F7) at its output of said each of the four channel routers 71, wherein the seventh frequency band (F7) may have the same bandwidth as the fifth frequency band (F5) and/or as the sixth frequency band (F6), and the seventh frequency band (F7) may cover the same frequency range as the fifth frequency band (F5) and/or as the sixth frequency band (F6).

Referring to FIG. 7, each of the four amplifiers 72 may have its input to be amplified as an output of said each of the four amplifiers 72 and have an optimum 1 dB compression point (P1 dB) to prevent electronic devices downstream of the four respective amplifiers 72 from being burned out when an excessive power is provided to one of the four amplifiers 72.

Referring to FIG. 7, the signal receiver 70 may generate four outputs from the four respective amplifiers 72 to four respective set top boxes in an indoor system through four respective cables.

Referring to FIG. 7, the integrated circuit chip 10 may be packaged like the above electronic package 40 to be mounted onto a mother circuit board (not shown) via the metal pins 45. Each of the amplifiers 51, each of the mixers 52, each of the local oscillators (LO) 53, each of the band-pass filters (BPF) 54, each of the splitters 55, each one in each set of three-stage amplifiers 56, each of the amplifiers 61 and each of the channel routers 71 may be implemented in another corresponding discrete integrated circuit chip to be packaged into another corresponding discrete electronic package that may be mounted onto the mother circuit board (not shown) via solder balls or metal pins of the another corresponding discrete electronic package, for example.

Figure 8:
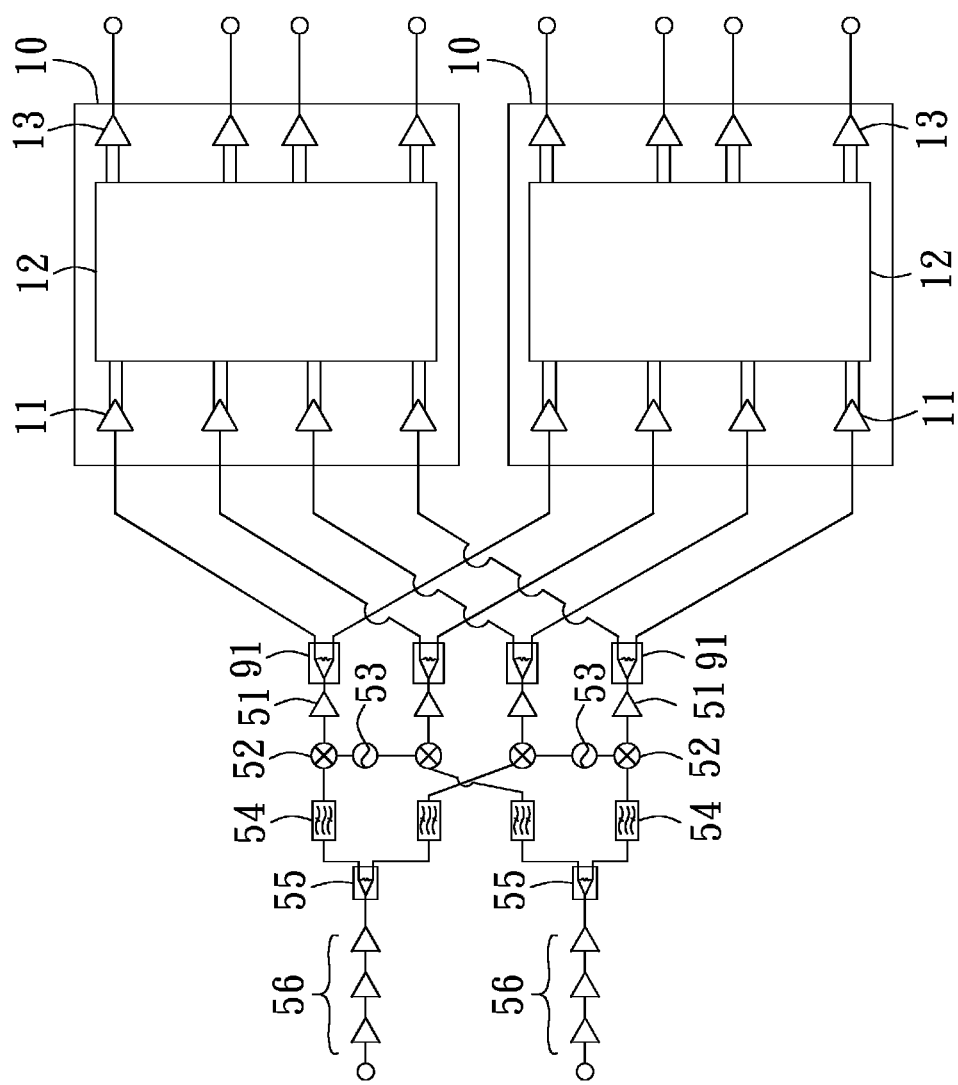
FIG. 8 illustrates a block diagram of a fourth combination for multiple of the integrated circuit chips illustrated in the first embodiment.

Fourth Combination for Integrated Circuit Chip Illustrated in the First Embodiment FIG. 8 illustrates a block diagram of a fourth combination for multiple of the integrated circuit chips 10 illustrated in the first embodiment. The same reference number illustrated in FIGS. 1, 5 and 8 indicates elements having the same functions.

In the fifth combination, referring to FIG. 8, another signal receiver 90, such as low-noise block (LNB), may be provided to process vertically and horizontally polarized signals or right-hand and left-hand circularly polarized signals collected by an antenna feed horn at a focal point of a reflector dish for a satellite in a field of view of the signal receiver 90. The signal receiver 90, in comparison to the block diagram illustrated in FIG. 5, may further include four splitters 91, i.e. power divider, arranged in parallel and downstream of the four respective amplifiers 51 and two integrated circuit chips 10, each of which may be referred to one illustrated in FIG. 1, arranged in parallel and downstream of the four splitters 91.

Referring to FIG. 8, each of the four splitters 91 may split its input into two identities with substantially the same power at two respective outputs of said each of the splitters 91 to be transmitted respectively to respective two of the amplifiers 11 of the two integrated circuit chips 10. The four splitters 91 have the four respective inputs coupled respectively to the four respective outputs of the four amplifiers 51.

Referring to FIG. 8, the signal receiver 90 may generate eight outputs from the eight respective amplifiers 13, each of which is provided by a corresponding one of the two integrated circuit chips 10, to eight respective set top boxes in an indoor system through eight respective cables.

Referring to FIG. 8, each of the two integrated circuit chips 10 may be packaged like the above electronic package 40 to be mounted onto a mother circuit board (not shown) via the metal pins 45. Each of the amplifiers 51, each of the mixers 52, each of the local oscillators (LO) 53, each of the band-pass filters (BPF) 54, each of the splitters 55, each of the splitters 91 and each one in each set of three-stage amplifiers 56 may be implemented in another corresponding discrete integrated circuit chip to be packaged into another corresponding discrete electronic package that may be mounted onto the mother circuit board (not shown) via solder balls or metal pins of the another corresponding discrete electronic package, for example.

Figure 9:
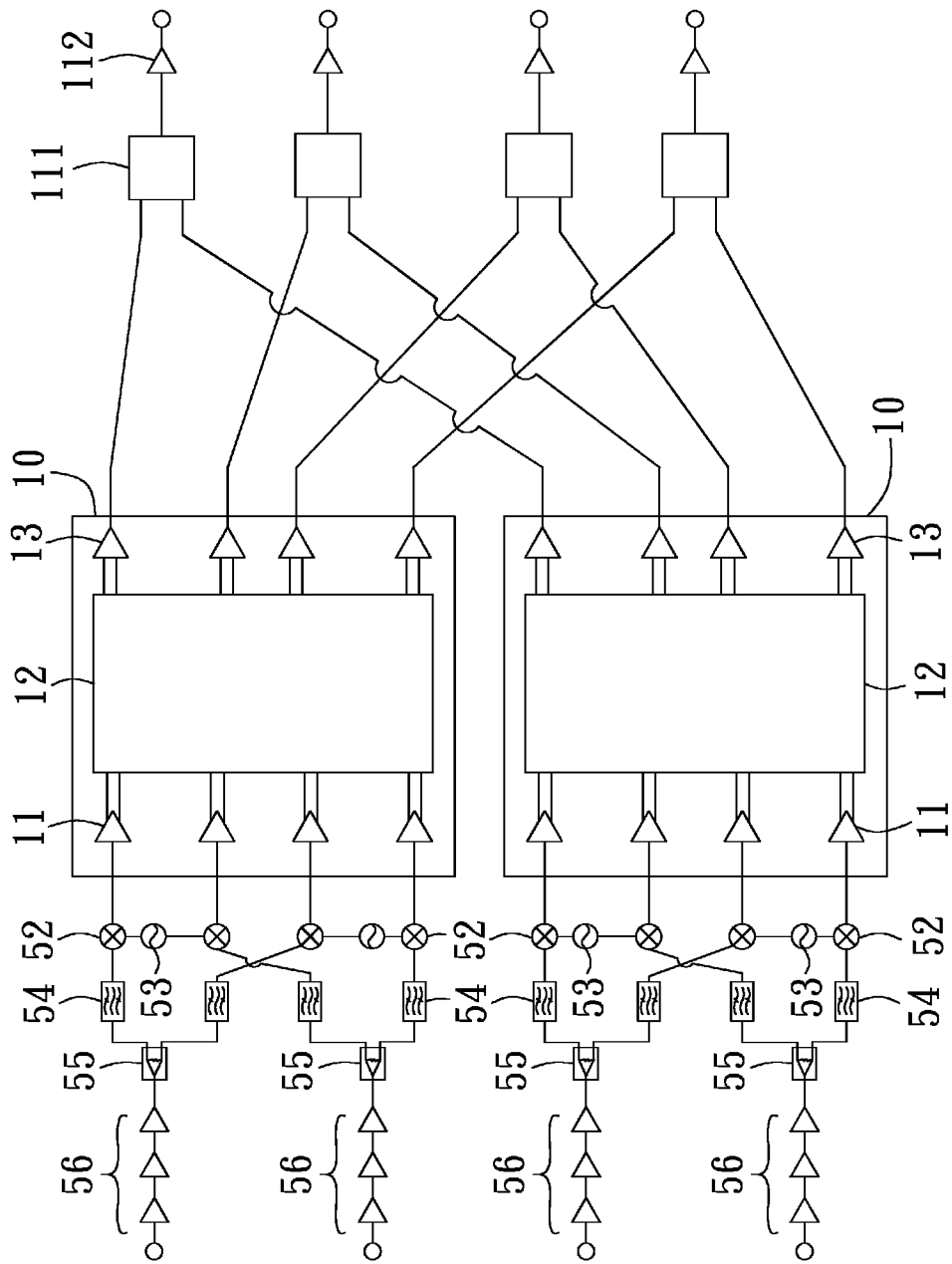
FIG. 9 illustrates a block diagram of a fifth combination for the integrated circuit chip illustrated in the first embodiment.

Fifth Combination for Integrated Circuit Chip Illustrated in the First Embodiment FIG. 9 illustrates a block diagram of a fifth combination for the integrated circuit chip 10 illustrated in the first embodiment. The same reference number illustrated in FIGS. 1, 5, 6 and 9 indicates elements having the same functions.

In the seventh combination, referring to FIG. 9, another signal receiver 110, such as low-noise block (LNB), may be provided to process two sets of vertically and horizontally polarized signals or two sets of right-hand and left-hand circularly polarized signals collected by two respective antenna feed horns at two respective focal points of a reflector dish for two satellites in a field of view of the signal receiver 110. The signal receiver 110 may include (1) two integrated circuit chips 10, each of which may be referred to one illustrated in FIG. 1, arranged in parallel, (2) four switch matrixs 111 arranged in parallel and downstream of the two integrated circuit chips 10 and (3) four amplifiers 112 arranged in parallel and downstream of the four respective switch matrixs 111.

Referring to FIG. 9, the elements upstream of each of the two integrated circuit chips 10 may be referred to the elements upstream of the integrated circuit chip 10 illustrated in FIG. 6. The vertically polarized signal collected from a first one of the two antenna feed horns at a first one of the focal points of the reflector dish for a first one of the satellites may be transmitted to the input of one, i.e. the top one, of the two sets of three-stage amplifiers 56 arranged upstream of a first one, i.e. the top one, of the two integrated circuit chips 10, and the horizontally polarized signal collected from the first one of the two antenna feed horns may be transmitted to the input of the other one, i.e. the second top one, of the two sets of three-stage amplifiers 56 arranged upstream of the first one of the two integrated circuit chips 10. The vertically polarized signal collected from a second one of the two antenna feed horns at a second one of the focal points of the reflector dish for a second one of the satellites may be transmitted to the input of one, i.e. the second bottom one, of the two sets of three-stage amplifiers 56 arranged upstream of a second one, i.e. the bottom one, of the two integrated circuit chips 10, and the horizontally polarized signal collected from the second one of the two antenna feed horns may be transmitted to the input of the other one, i.e. the bottommost one, of the two sets of three-stage amplifiers 56 arranged upstream of the second one of the two integrated circuit chips 10.

Alternatively, referring to FIG. 9, the right-hand circularly polarized signal collected from a first one of the two antenna feed horns at a first one of the focal points of the reflector dish for a first one of the satellites may be transmitted to the input of one, i.e. the top one, of the two sets of three-stage amplifiers 56 arranged upstream of a first one, i.e. the top one, of the two integrated circuit chips 10, and the left-hand circularly signal collected from the first one of the two antenna feed horns may be transmitted to the input of the other one, i.e. the second top one, of the two sets of three-stage amplifiers 56 arranged upstream of the first one of the two integrated circuit chips 10. The right-hand circularly signal collected from a second one of the two antenna feed horns at a second one of the focal points of the reflector dish for a second one of the satellites may be transmitted to the input of one, i.e. the second bottom one, of the two sets of three-stage amplifiers 56 arranged upstream of a second one, i.e. the bottom one, of the two integrated circuit chips 10, and the left-hand circularly signal collected from the second one of the two antenna feed horns may be transmitted to the input of the other one, i.e. the bottommost one, of the two sets of three-stage amplifiers 56 arranged upstream of the second one of the two integrated circuit chips 10.

Referring to FIG. 9, each of the four switch matrixs 111 may have two inputs arranged in parallel, one of which is coupled to a corresponding one of the four amplifiers 13 of one of the two integrated circuit chips 10 and the other one of which is coupled to a corresponding one of the four amplifiers 13 of the other one of the two integrated circuit chips 10. Each of the switch matrixs 111 may switch or pass one of its two inputs to its output coupled to an input of a corresponding one of the four amplifiers 112.

Referring to FIG. 9, each of the four amplifiers 112 may have its input to be amplified as an output of said each of the four amplifiers 112 and have an optimum 1 dB compression point (P1 dB) to prevent electronic devices downstream of the four respective amplifiers 112 from being burned out when an excessive power is provided to one of the four amplifiers 112.

Referring to FIG. 9, the signal receiver 110 may generate four outputs from the four respective amplifiers 112 to four respective set top boxes in an indoor system through four respective cables.

Referring to FIG. 9, each of the two integrated circuit chips 10 may be packaged like the above electronic package 40 to be mounted onto a mother circuit board (not shown) via the metal pins 45. Each of the mixers 52, each of the local oscillators (LO) 53, each of the band-pass filters (BPF) 54, each of the splitters 55, each of the combiners 111, each of the amplifiers 112 and each one in each set of three-stage amplifiers 56 may be implemented in another corresponding discrete integrated circuit chip to be packaged into another corresponding discrete electronic package that may be mounted onto the mother circuit board (not shown) via solder balls or metal pins of the another corresponding discrete electronic package, for example.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. An integrated circuit chip comprising:
a first single-ended-to-differential amplifier configured to generate a differential output associated with an input of said first single-ended-to-differential amplifier;
a second single-ended-to-differential amplifier arranged in parallel with said first single-ended-to-differential amplifier, wherein said second single-ended-to-differential amplifier is configured to generate a differential output associated with an input of said second single-ended-to-differential amplifier;
a first set of switch circuits arranged downstream of said first single-ended-to-differential amplifier, wherein one of said switch circuits in said first set comprises a differential input associated with said differential output of said first single-ended-to-differential amplifier;
a second set of switch circuits arranged downstream of said second single-ended-to-differential amplifier, wherein one of said switch circuits in said second set comprises a differential input associated with said differential output of said second single-ended-to-differential amplifier; and
a first differential-to-single-ended amplifier arranged downstream of a first one of said switch circuits in said first set and downstream of a first one of said switch circuits in said second set, wherein said first differential-to-single-ended amplifier comprises a differential input associated with a differential output of said first one of said switch circuits in said first set.

2. The integrated circuit chip of claim 1 further comprising a second differential-to-single-ended amplifier arranged downstream of a second one of said switch circuits in said first set and downstream of a second one of said switch circuits in said second set, wherein said second differential-to-single-ended amplifier comprises a differential input associated with a differential output of said second one of said switch circuits in said first set.

3. The integrated circuit chip of claim 1 further comprising a second differential-to-single-ended amplifier arranged downstream of a second one of said switch circuits in said first set and downstream of a second one of said switch circuits in said second set, wherein said second differential-to-single-ended amplifier comprises a differential input associated with a differential output of said second one of said switch circuits in said second set.

4. The integrated circuit chip of claim 1 further comprising a first set of differential-to-differential amplifiers arranged downstream of said first single-ended-to-differential amplifier and upstream of said first set of switch circuits, wherein one of said differential-to-differential amplifiers in said first set comprises a differential input is associated with said differential output of said first single-ended-to-differential amplifier and a differential output associated with said differential input of said one of said switch circuits in said first set.

5. The integrated circuit chip of claim 4 further comprising a second set of differential-to-differential amplifiers arranged downstream of said second single-ended-to-differential amplifier and upstream of said second set of switch circuits, wherein one of said differential-to-differential amplifiers in said second set comprises a differential input is associated with said differential output of said second single-ended-to-differential amplifier and a differential output associated with said differential input of said one of said switch circuits in said second set.

6. The integrated circuit chip of claim 4, wherein said one of said differential-to-differential amplifiers in said first set is powered on when said one of said switch circuits in said first set is switched to couple said one of said differential-to-differential amplifiers in said first set to said first differential-to-single-ended amplifier, and said one of said differential-to-differential amplifiers in said first set is powered off when said one of said switch circuits in said first set is switched not to couple said one of said differential-to-differential amplifiers in said first set to said first differential-to-single-ended amplifier.

7. The integrated circuit chip of claim 1, wherein said differential output of said first single-ended-to-differential amplifier has a phase difference of substantially 180 degrees.

8. The integrated circuit chip of claim 1, wherein said differential output of said one of said switch circuits in said first set has a phase difference of substantially 180 degrees.

9. The integrated circuit chip of claim 1, wherein said differential input of said one of said switch circuits in said first set has a phase difference of substantially 180 degrees.

10. The integrated circuit chip of claim 1, wherein said differential input of said first differential-to-single-ended amplifier has a phase difference of substantially 180 degrees.

11. The integrated circuit chip of claim 1 further comprising a third single-ended-to-differential amplifier arranged in parallel with said first and second single-ended-to-differential amplifiers, wherein said third single-ended-to-differential amplifier is configured to generate a differential output associated with an input of said third single-ended-to-differential amplifier, a fourth single-ended-to-differential amplifier arranged in parallel with said first, second and third single-ended-to-differential amplifiers, wherein said fourth single-ended-to-differential amplifier is configured to generate a differential output associated with an input of said fourth single-ended-to-differential amplifier, a third set of switch circuits arranged downstream of said third single-ended-to-differential amplifier, wherein one of said switch circuits in said third set comprises a differential input associated with said differential output of said third single-ended-to-differential amplifier, a fourth set of switch circuits arranged downstream of said fourth single-ended-to-differential amplifier, wherein one of said switch circuits in said fourth set comprises a differential input associated with said differential output of said fourth single-ended-to-differential amplifier, wherein said first differential-to-single-ended amplifier is further arranged downstream of a first one of said switch circuits in said third set and downstream of a first one of said switch circuits in said fourth set.

12. The integrated circuit chip of claim 1 is assembled in a signal receiver configured to process multiple signals from one or more satellites.

13. A signal receiver configured to process multiple signals from one or more satellites, comprising:
   a first single-ended-to-differential amplifier configured to generate a differential output associated with an input of said first single-ended-to-differential amplifier;
   a second single-ended-to-differential amplifier arranged in parallel with said first single-ended-to-differential amplifier, wherein said second single-ended-to-differential amplifier is configured to generate a differential output associated with an input of said second single-ended-to-differential amplifier;
   a first set of switch circuits arranged downstream of said first single-ended-to-differential amplifier, wherein one of said switch circuits in said first set comprises a differential input associated with said differential output of said first single-ended-to-differential amplifier;
   a second set of switch circuits arranged downstream of said second single-ended-to-differential amplifier, wherein one of said switch circuits in said second set comprises a differential input associated with said differential output of said second single-ended-to-differential amplifier; and
   a first differential-to-single-ended amplifier arranged downstream of a first one of said switch circuits in said first set and downstream of a first one of said switch circuits in said second set, wherein said first differential-to-single-ended amplifier comprises a differential input associated with a differential output of said first one of said switch circuits in said first set.

14. The signal receiver of claim 13 further comprising a second differential-to-single-ended amplifier arranged downstream of a second one of said switch circuits in said first set and downstream of a second one of said switch circuits in said second set, wherein said second differential-to-single-ended amplifier comprises a differential input associated with a differential output of said second one of said switch circuits in said first set.

15. The signal receiver of claim 13 further comprising a second differential-to-single-ended amplifier arranged downstream of a second one of said switch circuits in said first set and downstream of a second one of said switch circuits in said second set, wherein said second differential-to-single-ended amplifier comprises a differential input associated with a differential output of said second one of said switch circuits in said second set.

16. The signal receiver of claim 13 further comprising a first set of differential-to-differential amplifiers arranged downstream of said first single-ended-to-differential amplifier and upstream of said first set of switch circuits, wherein one of said differential-to-differential amplifiers in said first set comprises a differential input is associated with said differential output of said first single-ended-to-differential amplifier and a differential output associated with said differential input of said one of said switch circuits in said first set.

17. The signal receiver of claim 16 further comprising a second set of differential-to-differential amplifiers arranged downstream of said second single-ended-to-differential amplifier and upstream of said second set of switch circuits, wherein one of said differential-to-differential amplifiers in said second set comprises a differential input is associated with said differential output of said second single-ended-to-differential amplifier and a differential output associated with said differential input of said one of said switch circuits in said second set.

18. The signal receiver of claim 16, wherein said one of said differential-to-differential amplifiers in said first set is powered on when said one of said switch circuits in said first set is switched to couple said one of said differential-to-differential amplifiers in said first set to said first differential-to-single-ended amplifier, and said one of said differential-to-differential amplifiers in said first set is powered off when said one of said switch circuits in said first set is switched not to couple said one of said differential-to-differential amplifiers in said first set to said first differential-to-single-ended amplifier.

19. The signal receiver of claim 13, wherein said differential output of said first single-ended-to-differential amplifier has a phase difference of substantially 180 degrees.

20. The signal receiver of claim 13 further comprising a third single-ended-to-differential amplifier arranged in parallel with said first and second single-ended-to-differential amplifiers, wherein said third single-ended-to-differential amplifier is configured to generate a differential output associated with an input of said third single-ended-to-differential amplifier, a fourth single-ended-to-differential amplifier arranged in parallel with said first, second and third single-ended-to-differential amplifiers, wherein said fourth single-ended-to-differential amplifier is configured to generate a differential output associated with an input of said fourth single-ended-to-differential amplifier, a third set of switch circuits arranged downstream of said third single-ended-to-differential amplifier, wherein one of said switch circuits in said third set comprises a differential input associated with said differential output of said third single-ended-to-differential amplifier, a fourth set of switch circuits arranged downstream of said fourth single-ended-to-differential amplifier, wherein one of said switch circuits in said fourth set comprises a differential input associated with said differential output of said fourth single-ended-to-differential amplifier, wherein said first differential-to-single-ended amplifier is further arranged downstream of a first one of said switch circuits in said third set and downstream of a first one of said switch circuits in said fourth set.

* * * * *